United States Patent [19]

Charas

[11] Patent Number: 5,862,459
[45] Date of Patent: Jan. 19, 1999

[54] METHOD OF AND APPARATUS FOR FILTERING INTERMODULATION PRODUCTS IN A RADIOCOMMUNICATION SYSTEM

[75] Inventor: Philippe Charas, Upplands Väsby, Sweden

[73] Assignee: Telefonaktiebolaget LM Ericsson, Stockholm, Sweden

[21] Appl. No.: 697,279

[22] Filed: Aug. 27, 1996

[51] Int. Cl.$^6$ .................................. H04B 1/04; H03F 1/32
[52] U.S. Cl. ............................. 455/114; 455/115; 330/52; 330/149
[58] Field of Search ............................. 455/63, 67.1, 69, 455/91, 101, 102, 103, 110, 111, 114, 115, 116, 117, 119; 375/296, 297; 330/129, 149, 151, 124 R, 52

[56] References Cited

U.S. PATENT DOCUMENTS

| | | | |
|---|---|---|---|
| 4,389,618 | 6/1983 | Bauman | 330/149 |
| 4,554,514 | 11/1985 | Whartenby et al. | 330/149 |
| 4,560,945 | 12/1985 | Olver | 455/63 |
| 4,885,551 | 12/1989 | Myer | 330/149 |

FOREIGN PATENT DOCUMENTS

| | | |
|---|---|---|
| 595247 | 5/1994 | European Pat. Off. . |
| 2296615 | 7/1996 | United Kingdom . |
| WO91/16760 | 10/1991 | WIPO . |
| WO94/09568 | 4/1994 | WIPO . |
| WO94/17587 | 8/1994 | WIPO . |

Primary Examiner—Thanh Cong Le
Attorney, Agent, or Firm—Burns, Doane, Swecker & Mathis, L.L.P.

[57] ABSTRACT

An improved feed-forward multi carrier power amplifier architecture is described along with a novel array antenna wherein the improved amplifier may be advantageously put to use. The improved amplifier provides for independent control of unwanted intermodulation products generated in the amplifier. When used in the novel array structure, a separate radiation lobe containing the unwanted intermodulation products may be steered independently from a main radiation lobe. In a cellular base station application, the radiation lobe containing the unwanted intermodulation products may be steered away from the main radiation lobe thereby providing spatial filtering of the unwanted signals. The radiation lobe containing the unwanted intermodulation products may be steered rapidly in time using, for example, a noise like function to provide statistical averaging of the interference in the direction of desired communications.

14 Claims, 5 Drawing Sheets

METHOD OF AND APPARATUS FOR FILTERING INTERMODULATION PRODUCTS IN A RADIOCOMMUNICATION SYSTEM

BACKGROUND

The present invention relates to cellular radio communications in general, and more specifically, to a feed-forward multicarrier power amplifier architecture and to a method of and apparatus for spatially filtering unwanted intermodulation products using A feed-forward multi-carrier power amplifier in an array antenna architecture.

In noise limited radio communication systems, the ability of a radio receiver to receive a radio signal broadcast by a distant transmitter is limited by the amount of thermal noise present in the radio channel and the noise introduced by the receiver itself. In cellular radio communication systems, the ability of a mobile station to receive signals transmitted by a base station is limited not so much by the thermal noise in the radio channel, but rather by the amount of interference present in the radio channel. Interference arises from several sources: so-called co-channel interference arises from radio communications between base stations and mobile stations in adjacent or distant cells which occur on the same frequency band; so-called adjacent-channel interference arises from radio communications between base stations and mobile stations in the same cell or from adjacent cells operating on adjacent frequency bands. Imperfect filtering in the receivers and transmitters allows some of the radio frequency energy in one band to spill-over to and interfere with other radio frequency bands. Another potentially significant source of interference arises from intermodulation products generated by amplitude modulation to amplitude modulation (AM to AM) and amplitude modulation to phase modulation (AM to PM) conversion in the base station and mobile station amplifiers. This problem is usually most severe in the downlink (i.e., signals transmitted by the base station) since the base station often simultaneously broadcasts multiple carrier frequencies which can mix with one another in the amplifiers.

In power amplifiers, a trade-off is made between DC to RF power conversion efficiency and the level of intermodulation products generated by the amplifier. Thus, good DC to RF power conversion efficiency and high spectral purity can be contradictory requirements. The choice of amplifier is therefore significant in the design of the cellular base station architecture.

To date, there have been several base station architectures identified. Most commonly, base stations use a single carrier power amplifier (SCPA) with a frequency selective combiner. This architecture offers about 6–7% overall DC to RF power conversion efficiency due to the insertion losses encountered in the accompanying frequency combiner. The frequency combiner is also large and has "static" frequency selectivity which may need to be manually tuned during the base station installation.

Another common choice of architecture employs a multi-carrier power amplifier (MCPA). Unfortunately, MCPAs should generally be highly linear to avoid generating intermodulation products arising from the mixing of the different modulated carrier frequencies within the amplifier. Therefore, even though no frequency combiner is required, this solution only offers an overall DC to RF power conversion efficiency of about 4–6%. Although comparable to the above mentioned SCPA/frequency combiner solution, the MCPA typically has much lower robustness and reliability. A high power MCPA is also a complex technology, i.e., not easy to master in production.

Finally, an SCPA can be used with antenna combiners to give an overall DC to RF power conversion efficiency of approximately 22%, which is achieved at the expense of mast mounted power amplifiers and a surface area more or less proportional to the number of carriers. The robustness of this design can be improved by distributing small power amplifiers in an array, using spatial combination of a number of antenna elements instead of one central power amplifier per antenna.

Use of an MCPA and array antenna combining would be an attractive solution if the overall DC to RF power conversion efficiency of this solution could be improved. Current MCPA designs do not, however, promise to produce the needed improvements in efficiency.

The intermodulation introduced by MCPAs can be reduced by using one of two methods: feed-forward cancellation amplification, or linear amplification with non-linear components (LINC). LINC amplification is quite complex and is currently completely unsuitable for low-cost, mass produced amplifiers.

A block diagram of a conventional feed-forward cancellation amplifier is illustrated in FIG. 1A. In FIG. 1A, an RF input signal, whose spectrum is illustrated in FIG. 1B, is applied to coupler 100a which couples portions of the input signal to delay line 140 and to main amplifier 110. Main amplifier 110 produces the amplified output whose signal spectrum is illustrated in FIG. 1C. The additional spectral components shown in FIG. 1C as compared with FIG. 1B are the intermodulation products generated due to nonlinearities in main amplifier 110. A portion of the amplified output signal spectrum shown in FIG. 1C is coupled to summer 150 by coupler 100b. Delay line 140 delays the coupled portion of the input signal with respect to the output of main amplifier 110 producing a delayed signal such that the two signals reach summer 150 at approximately the same time. The output of summer 150 is an error signal which is coupled to auxiliary amplifier 160. Auxiliary amplifier 160 adjusts the amplitude of the error signal producing an error correction signal illustrated in FIG. 1D. The error correction signal should be matched in amplitude to the intermodulation products generated by main amplifier 110, but reversed in phase. The resultant vector cancellation of the intermodulation products is performed in coupler 100c where the error correction signal is subtracted from the amplified input signal. For the output signal illustrated in FIG. 1E to have intermodulation products which are greater than −60 dB down from the carrier frequencies, the vector cancellation must be performed with a high degree of accuracy. Typically this requires that the error correction signal be maintained with greater than 0.5 degrees phase accuracy and 0.1 dB amplitude accuracy which is difficult to achieve in production. The feed-forward technique can be used in an MCPA to effectively suppress intermodulation products but at the cost of low power efficiency and a high demand on complexity and component cost. In particular, high power MCPAs are difficult to master in production.

Accordingly, it would be advantageous to construct a phased array antenna which uses MCPAs in which intermodulation products can be managed without having to resort to expensive and power inefficient feed-forward cancellation techniques.

SUMMARY

According to a first exemplary embodiment of the present invention, a method of and apparatus for an improved feed-forward multi-carrier power amplifier architecture is described. The improved MCPA provides a main amplifier for amplifying an input signal having a plurality of carrier frequencies which produces an amplified output signal comprising the desired signals and additional unwanted frequency components. An error signal representative of unwanted frequency components in the amplified output signal is combined with a reference signal to generate a phase shifter input signal which is phase shifted (and/or possibly amplitude varied) in response to a control signal. The control signal is updated by comparing the amount of phase shift provided by the phase shifter with a phase offset value. The phase offset value may be time varying.

According to a second exemplary embodiment of the present invention, a method of and apparatus for using the improved feed-forward MCPA is employed and described. A phased array architecture is presented such that a plurality of radiation lobes are produced. In at least one of the lobes, the unwanted frequency components (i.e., intermodulation products) are independently steered from the main lobe thereby providing spatial filtering of the unwanted frequency components.

BRIEF DESCRIPTION OF THE DRAWINGS

An exemplifying embodiment of the invention will now be described in more detail with reference to the accompanying drawings, in which like descriptive labels are used to refer to similar elements, wherein.

DETAILED DESCRIPTION

In the following description, for purposes of explanation and not limitation, specific details are set forth, such as particular circuits, circuit components, techniques, etc. in order to provide a thorough understanding of the invention. However it will be apparent to those skilled in the art that the present invention may be practiced in other embodiments that depart from these specific details. In other instances, detailed descriptions of well-known methods, devices, and circuits are omitted so as not to obscure the description of the present invention with unnecessary detail.

Figure 2A:
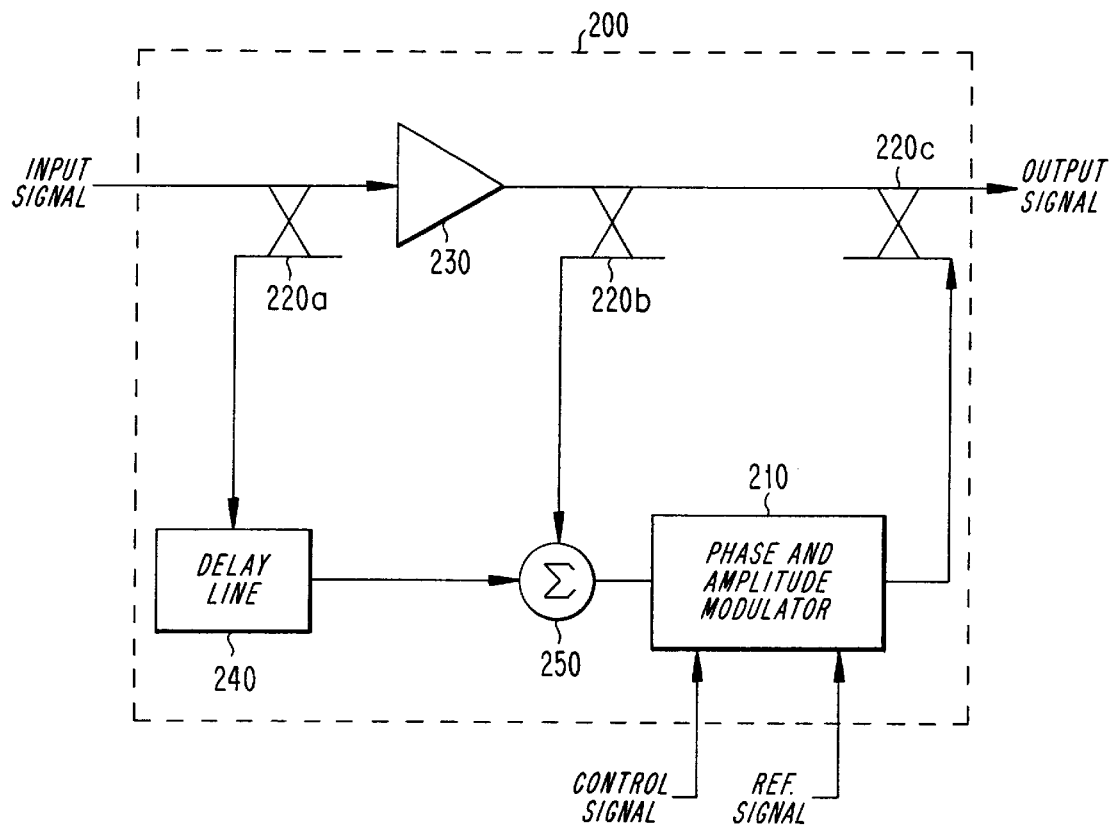
FIG. 2A is a schematic block diagram of feed-forward power amplifier according to a first exemplary embodiment of the present invention.
Figure 2B:
FIG. 2B illustrates an exemplary signal spectrum for an input signal associated with the block diagram of FIG. 2A.
Figure 2C:
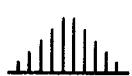
FIG. 2C illustrates an exemplary signal spectrum for an amplified signal associated with the block diagram of FIG. 2A.

The block diagram schematic of a feed forward amplifier 200 according to a first exemplary embodiment of the invention is illustrated in FIG. 2A. In FIG. 2A, an input signal, whose signal spectrum is illustrated in FIG. 2B, is applied to coupler 220a which couples portions of the input signal to delay line 240 and to main amplifier 230. Main amplifier 230 produces the amplified output signal spectrum shown in FIG. 2C, a portion of which is coupled to summer 250 by coupler 220b. The additional spectral components shown in FIG. 2C as compared with FIG. 2B are the unwanted intermodulation products generated due to non-linearities in main amplifier 230. Delay line 240 delays the coupled portion of the input signal with respect to the amplified output signal from main amplifier 230 producing a delayed signal such that the two signals reach summer 250 at approximately the same time. The output of summer 250 is an input error signal representative of the unwanted intermodulation products.

Figure 1A:
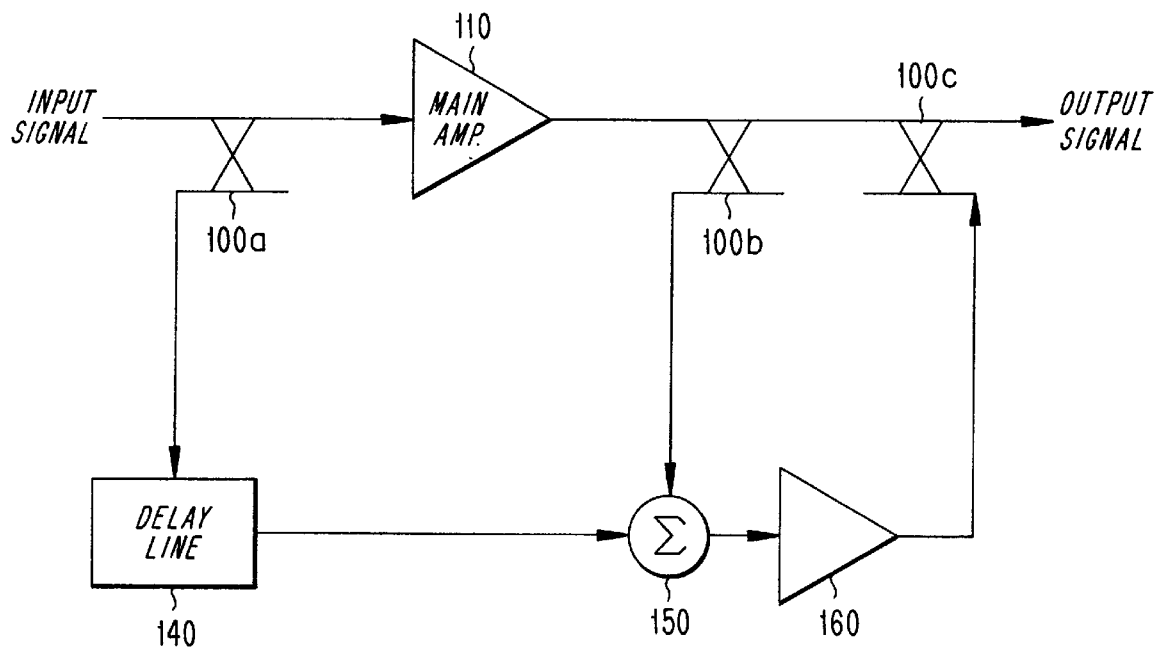
FIG. 1A is a schematic block diagram of a conventional feed-forward cancellation power amplifier.
Figure 1B:
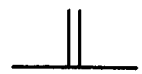
FIG. 1B illustrates an exemplary signal spectrum for an input signal associated with the block diagram of FIG. 1A.
Figure 1C:
FIG. 1C illustrates an exemplary signal spectrum for an amplified signal associated with the block diagram of FIG. 1A.
Figure 1D:
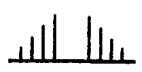
FIG. 1D illustrates an exemplary signal spectrum for an error signal associated with the block diagram of FIG. 1A.
Figure 1E:
FIG. 1E illustrates an exemplary signal spectrum for an output signal associated with the block diagram of FIG. 1A.
Figure 2D:
FIG. 2D illustrates an exemplary signal spectrum for an error correction signal associated with the block diagram of FIG. 2A.
Figure 2E:
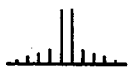
FIG. 2E illustrates an exemplary signal spectrum for an output signal associated with the block diagram of FIG. 2A.

The input error signal is coupled to phase and amplitude modulator 210 which adjusts the phase and amplitude of the input error signal in response to a control signal received from phase control processor 215 (shown in FIG. 2F) producing the error correction signal shown in FIG. 2D. The error correction signal is controlled such that the vector addition of the amplified output signal and the error correction signal results in an intermodulation vector of suitable phase and amplitude. This means that the intermodulation products in the output signal (shown in FIG. 2E) have not been reduced to zero (as in FIG. 1E), but rather will remain in the output signal with phase and amplitude which is determined by the phase and amplitude modulator 210. This feature of the feed-forward amplifier according to the present invention allows independent control of the phase and amplitude of the intermodulation products generated by main amplifier 230 which feature may further be advantageously used in a phased array antenna to control the direction of radiation of the intermodulation products independently of the primary radiation lobe as will be described in the ensuing figures and text.

Figure 2F:
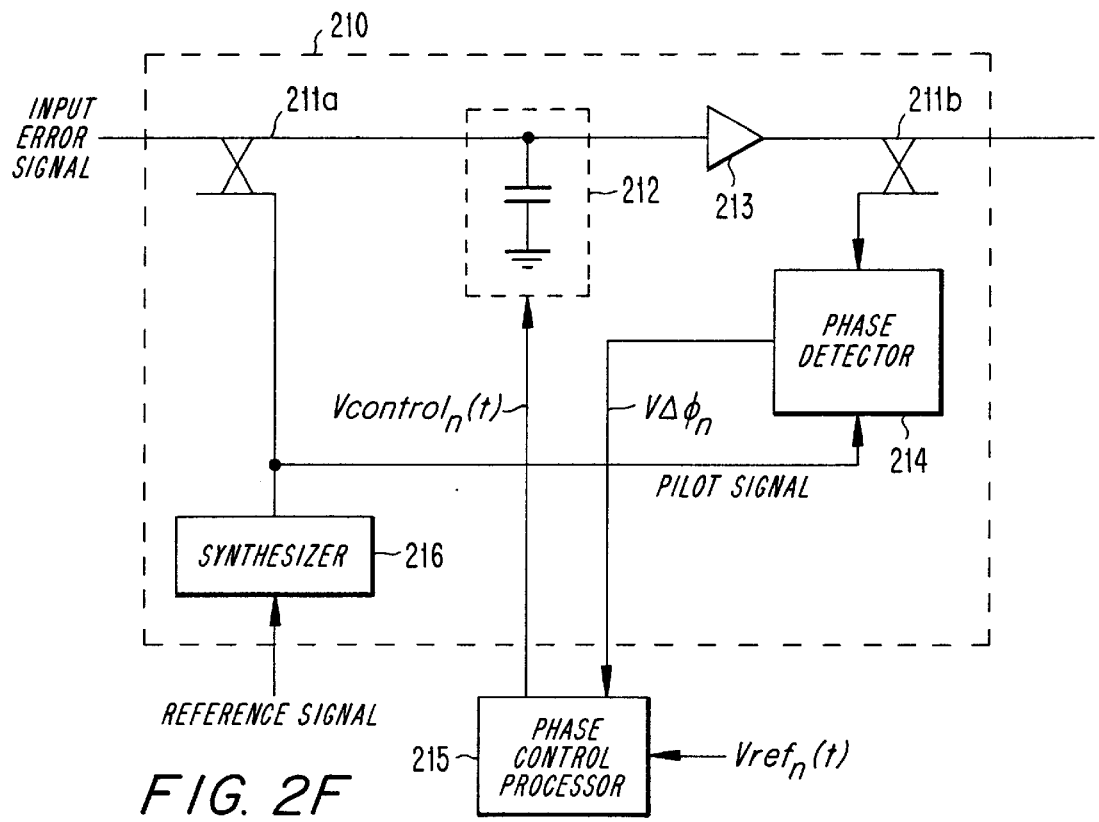
FIG. 2F is a schematic block diagram of a phase and amplitude modulator advantageously employed as part of the feed-forward power amplifier of the present invention.

An exemplary implementation of the phase and amplitude modulator 210 is illustrated in FIG. 2F. Synthesizer 216 receives a low frequency, e.g. 10 MHz, reference signal from a common reference source (not shown). Synthesizer 216 converts the reference signal to a pilot signal which is close to the frequency of the input signal, but slightly out of band so that the pilot signal will be treated as any other intermodulation product appearing out of band. The pilot signal from synthesizer 216 is injected into phase shifter 212 by way of coupler 211a where the pilot signal is combined with the output of summer 250 (shown in FIG. 2A) which is the input error signal representative of the unwanted intermodulation products. The output of coupler 211a is referred to herein as the phase shifter input signal.

Phase shifter 212 may be any suitable two port network where the phase difference between the output and input signals may be controlled by a control signal (e.g., DC bias). In the exemplary modulator 210, phase shifter 212 is a loaded line phase shifter, but may also be a switched network, switched line, amplifier type or reflection type network. In a loaded line phase shifter, the mechanism of phase shift is the variance of a small reactance placed across the transmission line. A varactor diode, whose capacitance is variable by means of a varying DC bias, may be suitably used for the variable reactance. This arrangement provides for a simple low-cost construction, moderate insertion loss, and is easily controlled for coarse phase adjustments.

Phase shifter 212 shifts the phase of the phase shifter input signal responsive to the control signal received from phase control processor 215. The output of phase shifter 212 is coupled to amplifier 213. As will be apparent to one skilled in the art, the gain of amplifier 213 may be variable, but for simplicity is shown as a fixed gain amplifier. The amplified output signal is the error correction signal. The error correction signal contains, as a component, the phase shifted version of the pilot signal originally injected at coupler 211a. The error correction signal is coupled to coupler 211b which couples a portion of error correction signal to phase detector 214. Phase detector 214 compares the phase shifted pilot signal received from coupler 211b with the pilot signal received from synthesizer 216 and generates a voltage, $V\Delta\phi_n$, where the subscript n refers to a particular feed-forward amplifier 200 where there are a plurality of feed-forward amplifiers 200. Voltage $V\Delta\phi_n$, which is representative of the phase difference between the injected and phase shifted pilot signals, is coupled to phase control processor 215 which compares $V\Delta\phi_n$ with a reference voltage $Vref_n(t)$, which may be time varying. Phase control processor 215 produces a control signal $Vcontrol_n(t)$ which is applied to phase shifter 212 to control the amount of phase shift. By using a time variable reference voltage $Vref_n(t)$ it is possible to control the phase shift of phase shifter 212 in accordance with any desired function such as, for example, a random noise function, saw-tooth, or sinusoidal variance with time. In this way, the intermodulation products can be spread out in space (as opposed to being constrained to a single IM lobe) to make the negative IM effects less apparent. The choice of $Vref_n(t)$ represents a tradeoff between efficiency (i.e., spectrally more efficient to steer all IM products away from desired signal direction) versus reduced complexity (i.e., less effort required to track and control phase if IM products are spread out).

Figure 3:
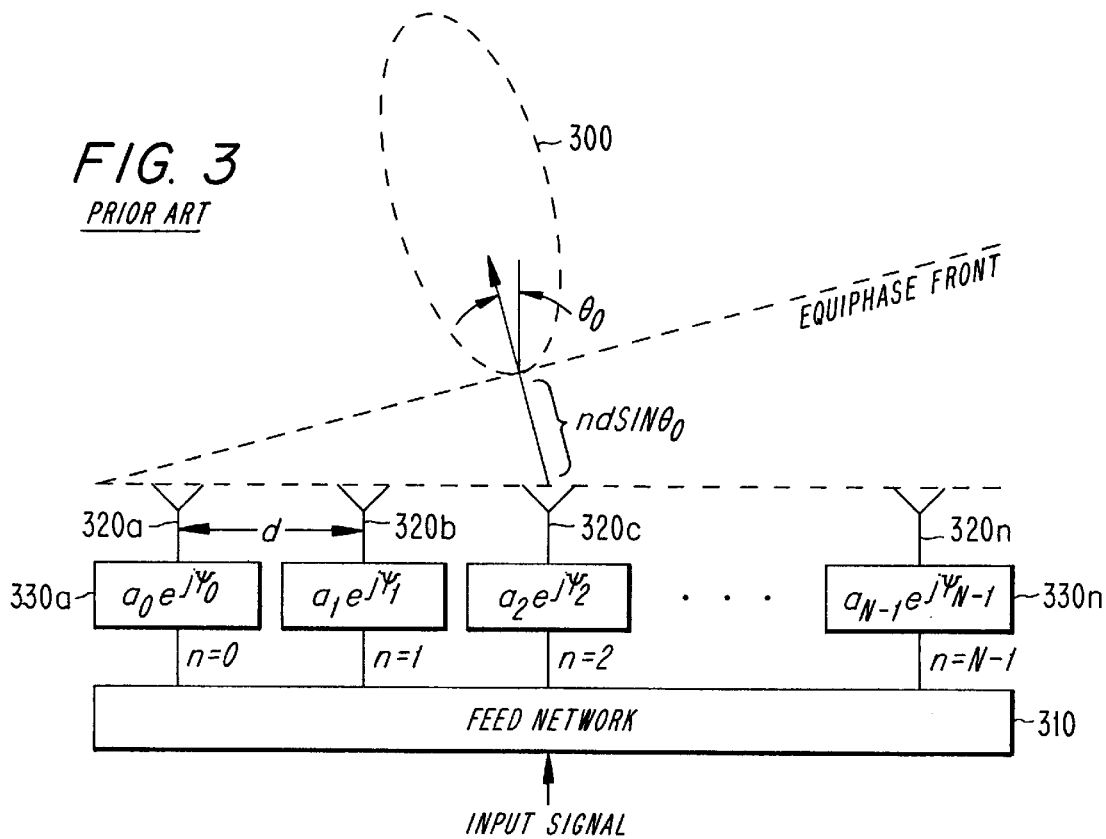
FIG. 3 is a schematic block diagram illustrating the operation of a conventional linear phased array antenna.

FIG. 3 is a schematic block diagram of a conventional linear phased array antenna. A linear array includes a plurality of individual radiating elements 320a–n spaced along a line at a distance d from one another. An input signal is coupled through feed network 310 and divided into a plurality of outputs, each output coupled to an individual radiating element 320a–n. In the simplest architecture, all of the outputs of the feed network 310 are matched in phase and amplitude, but other relationships are possible. In particular, an amplitude taper can be applied across the feed network such that end elements receive slightly less power than the center elements of the array thereby improving sidelobe performance. For the present example, it is assumed that the outputs of feed network are all in-phase and of equal amplitude. At the base of each radiating element 320a–n is a phase shifting and amplitude varying device 330a–n, respectively, which controls the relative amplitude and phase fed to each radiating element 320a–n. In a phased array, the radiation patterns of each radiating element 320a–n combine in space to form a composite radiation pattern for the array which may be described by the array factor:

$$E_u = \sum_{n=0}^{N-1} a_n e^{j(\Psi_n - nkd\sin\Theta)}$$

where: $k=2\pi/\lambda$.

The set of coefficients $a_n$ is referred to as the array-amplitude taper, while the $\Psi_n$ parameters are referred to as the phase taper. To produce a maximum value for the radiated field in the direction of the scan angle $\Theta_0$ all of the $\Psi_n$ parameters should have the form:

$$\Psi_n = -nkd\sin\Theta_0$$

The expression for $\Psi_n$ illustrates that to produce a maximum value for the radiated field in the direction of the scan angle $\Theta_0$ the phase taper across the array is a linear taper. A linear taper is one in which there is a constant phase difference between adjacent radiating elements 320a–n. With this in mind, the expression for the array factor may be re-written as:

$$E_u = \sum_{n=0}^{N-1} a_n e^{jnkd(\sin\Theta - \sin\nu)}$$

In the simplest example, where there is no amplitude taper and all of the $a_n$ coefficients are set equal to unity, the above equation for the array factor may be further simplified as:

$$E_a(\Theta) = \frac{\sin\left[N\pi\frac{d}{\lambda}(\sin\Theta - \sin\Theta_n)\right]}{N\sin\left[\pi\frac{d}{\lambda}(\sin\Theta - \sin\Theta_n)\right]}$$

Figure 4:
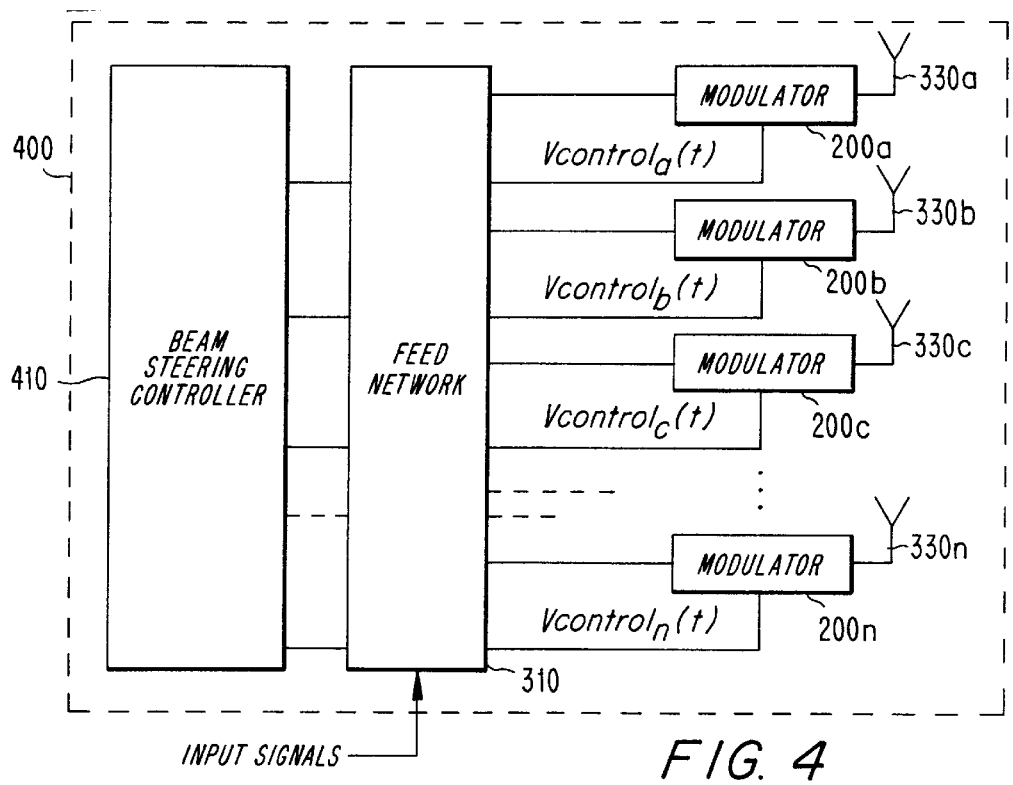
FIG. 4 is a schematic block diagram of a phased array antenna according to a second exemplary embodiment of the present invention.

Referring now to FIG. 4, an antenna 400 according to a second exemplary embodiment of the present invention is illustrated in which the feed-forward amplifier described hereinabove may be advantageously employed. In FIG. 4, an input signal is coupled to feed network 310 which divides the input signal into a plurality of outputs. The plurality of outputs of feed network 310 is each coupled to feed forward amplifiers 200a–n previously described hereinabove. The output of each feed forward amplifier 200a–n is coupled to a radiating element 330a–n respectively. Control signals to each feed-forward amplifier 200a–n are provided by beam steering controller 410. The operation of antenna 400 may be explained with the assistance of the schematic block diagram illustrated in FIG. 5 where for simplicity the number of antenna elements 320a–n has been restricted to two.

Figure 5:
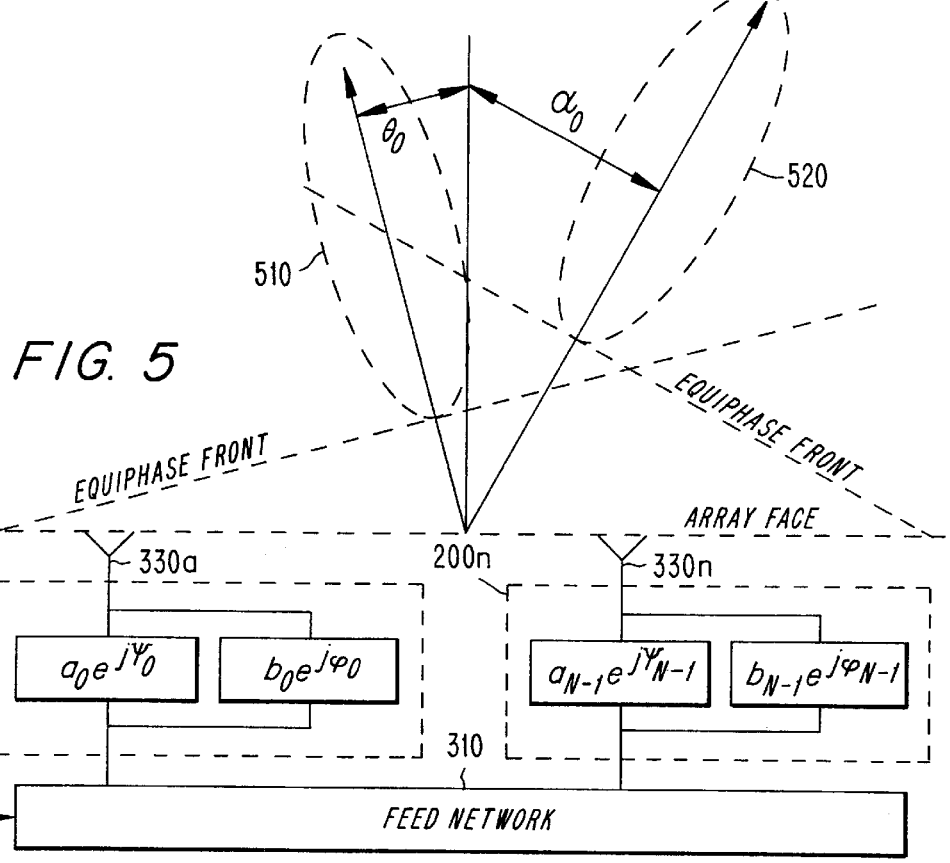
FIG. 5 is a schematic block diagram illustrating the operation of the phased array antenna of FIG. 4.

As shown in FIG. 5, each feed forward amplifier 200a–n can be viewed as producing two separate signals: one of which is the desired signal whose phase and amplitude is modified according to $a_n e^{j\Psi_n}$ and the undesired IM signal whose phase and amplitude is modified according to $b_n e^{j\phi_n}$. In the simplest example, no amplitude taper is used and the amplitude coefficients $a_n$ and $b_n$ are set equal to unity. A first phase taper is applied to the $\Psi_n$ parameters resulting in a first beam 510 comprising the desired signal(s) being radiated in the direction of scan angle $\Theta_0$. A second phase taper is applied to the $\phi_n$ parameters resulting in a second beam 520 comprising the unwanted signals being radiated in the direction of scan angle $\alpha_0$. Sidelobes of the second beam 520 will be present in the direction of the first beam 510, but at a sufficiently low level so as not to present an interference problem in the direction of the first beam 510.

Figure 6:
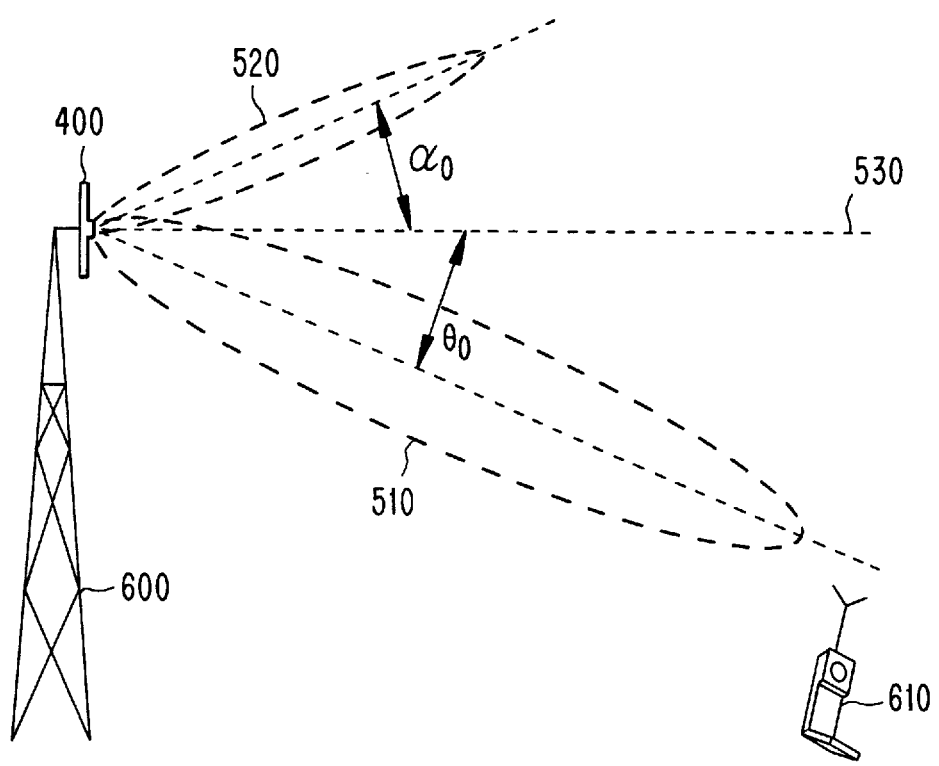
FIG. 6 is an illustration of a phased array antenna according to a second exemplary embodiment of the present invention as used in a cellular base station application.

FIG. 6 illustrates an example of how array antenna 400 may be employed in an exemplary radio communication system. Antenna 400 is mounted on a mast tower 600, the top of building, or any other suitable location which elevates antenna 400 a suitable distance above the ground and which provides a clear line of sight communication path between mobile station(s) 610 operating within the vicinity of the base station and the base station antenna 400. A plurality of radiation patterns 510 and 520 are produced by antenna 400. For simplicity, only two patterns will be discussed: one in which the desired downlink signals are radiated which will be referred to as the primary radiation pattern, or primary lobe 510; and one in which unwanted intermodulation products are radiated which will be referred to as the intermodulation (IM) radiation pattern, or IM lobe 520. Primary lobe 510 is angled downward from a plane 530 parallel with the surface of the earth either by physically pointing antenna 400 downwards, or alternatively by providing a linear phase taper across the outputs of feed network 310. IM lobe 520, which contains the unwanted intermodulation products, is oriented upwards and away from the primary lobe 510 by applying the appropriate phase taper to the error correction signals generated in each feed forward amplifier 200a–n.

Alternatively, the IM lobe 520 may be advantageously spatially spread by applying a time varying phase offset control signal to amplifiers 200a–n. The time variation may be in the form of a saw-tooth wave to "sweep" the IM beam across a wide scan angle, or a noise related variation may be used to "spread" the IM beam across a wide scan angle.

According to the inventive techniques described above, a number of relatively small amplifiers can be used in place of a single large amplifier. These smaller amplifiers are, typically, more power efficient than the larger ones used conventionally in SCPA applications. Cable losses after the amplifying stage are substantially reduced, since the smaller amplifiers are mounted on the antenna array. The DC to RF power conversion efficiency according to exemplary embodiments of the present invention will typically be about the same as that associated with the SCPA antenna/combiner method, but with the advantage that the antenna sizes are independent of the number of transmitted carriers.

While the present invention has been described with respect to particular exemplary embodiments, those skilled in the art will recognize that the present invention is not limited to the specific embodiments described and illustrated herein. Different embodiments and adaptations besides those shown and described as well as many variations, modifications and equivalent arrangements will now be reasonably suggested by the foregoing specification and drawings without departing from the substance or scope of the invention. While the present invention has been described herein in detail in relation to these embodiments, it is to be understood that this disclosure is only illustrative and exemplary of the present invention and is merely for the purposes of providing a full and enabling disclosure of the invention. Accordingly, it is intended that the invention be limited only by the spirit and scope of the claims appended hereto.

What is claimed is:

1. A feed-forward multi-carrier power amplifier, comprising:

a main amplifier for amplifying an input signal having a plurality of carrier frequencies and producing an amplified output signal including desired signals and unwanted frequency components;

means coupled to said main amplifier for generating an error signal representative of said unwanted frequency components in the amplified output signal;

synthesizer means for generating a pilot signal from a reference signal;

combiner means for combining the pilot signal with the error signal to generate a phase shifter input signal;

phase shifting means for varying, with respect to an input phase of the phase shifter input signal, the output phase of the phase shifter input signal and producing an error correction signal;

phase detector means for generating a phase offset indication of a relative difference in phase between the pilot signal and the error correction signal;

phase control processor means for comparing the phase offset indication with a phase offset value and generating a control signal;

phase control means for adjusting the phase shifting means responsive to the control signal; and means for combining the error correction signal and the amplified output signal.

2. A feed-forward multi-carrier power amplifier according to claim 1 wherein said phase offset value is a time varying value.

3. A feed-forward multi-carrier power amplifier according to claim 1 where both the phase and amplitude of the error correction signal are varied.

4. A method for controlling the amplitude and phase of unwanted signals in a multi-carrier power amplifier, comprising the steps of:

a) amplifying an input signal having a plurality of carrier frequencies and producing an amplified output signal including a desired signal and unwanted frequency components;

b) generating an error signal representative of said unwanted frequency components in the amplified output signal;

c) generating a pilot signal from a reference signal;

d) combining the pilot signal with the error signal to generate a phase shifter input signal;

e) varying, with respect to an input phase, the output phase of the phase shifter input signal and producing an error correction signal;

f) generating a phase offset indication of the relative difference in phase between the pilot signal and the error correction signal;

g) comparing the phase offset indication with a phase offset value and generating a control signal;

h) adjusting the phase shifting means responsive to the control signal; and i) combining the error correction signal and the amplified output signal.

5. The method according to claim 4 where both phase and amplitude of the error correction signal are varied.

6. The method according to claim 4 where the phase offset value is time varying.

7. A cellular radio base station having a phased array antenna comprising:

a plurality of feed forward multi-carrier power amplifiers, each comprising:

a main amplifier for amplifying an input signal having a plurality of carrier frequencies and producing an amplified output signal including desired signals and unwanted frequency components;

means for generating an error signal representative of the unwanted frequency components in the amplified output signal;

phase control means for adjusting a phase of said error signal and producing an error correction signal; and means for combining the error correction signal and the amplified output signal;

a radiating element coupled to each of said plurality of feed-forward power amplifiers and spaced apart from each other along a line such that a plurality of radiating elements forms an array aperture;

means for providing a first phase taper across the radiating elements such that an array factor for the desired signal is oriented at a first angle; and means for providing a second phase taper across the radiating elements such that an array factor for the unwanted frequency components is oriented at a second angle away from said first angle.

8. A cellular radio base station according to claim 7 wherein said second angle is time varying.

9. A cellular radio base station according to claim 7 where both phase and amplitude of the error correction signal are varied.

10. A cellular radio base station according to claim 7, further comprising:

means for providing an amplitude taper across the radiating elements such that end elements receive slightly less power than center elements.

11. A method for spatially filtering unwanted signal components in a cellular radio base station having a phased array antenna, comprising the steps of:

a) amplifying an input signal having a plurality of carrier frequencies and producing an amplified output signal including a desired signal and unwanted frequency components;

b) generating an error signal representative of the unwanted frequency components in the amplified output signal;

c) adjusting the phase of said error signal and producing an error correction signal;

d) combining the error correction signal and the amplified output signal;

e) radiating the combined error correction signal and the amplified output signal from a plurality of radiators which are spaced apart from each other along a line such that the plurality of radiating elements forms an array aperture;

f) providing a first phase taper across the radiating elements such that the array factor for the desired signal is oriented at a first angle; and g) providing a second phase taper across the radiating elements such that the array factor for the unwanted frequency components is oriented at a second angle away from said first angle.

12. The method according to claim 11 wherein said second angle is time varying.

13. The method according to claim 11 where both phase and amplitude of the error correction signal are varied.

14. The method of claim 11 further comprising the step of:

providing an amplitude taper for an intermodulation lobe across the radiating elements such that end elements receive less power than center elements, whereby sidelobes of the intermodulation radiation pattern in the direction of the main lobe are reduced.

\* \* \* \* \*